United States Patent [19]

Schoofs

[11] Patent Number: 5,304,865
[45] Date of Patent: Apr. 19, 1994

[54] COMPARATOR CIRCUIT COMPRISING INPUT SIGNAL ATTENUATOR

[75] Inventor: Franciscus A. C. M. Schoofs, Eindhoven, Netherlands

[73] Assignee: U.S. Philips Corporation, New York, N.Y.

[21] Appl. No.: 10,229

[22] Filed: Jan. 28, 1993

[30] Foreign Application Priority Data

Feb. 3, 1992 [EP] European Pat. Off. ......... 92200297.7

[51] Int. Cl.[5] .............................................. H03K 5/153
[52] U.S. Cl. .................................... 307/362; 307/354; 307/303.2
[58] Field of Search ...................... 307/354, 362, 296.4, 307/303.2

[56] References Cited

U.S. PATENT DOCUMENTS

| | | | |
|---|---|---|---|
| 5,063,307 | 11/1991 | Zommer | 307/362 |
| 5,111,136 | 5/1992 | Kawashima | 307/362 |
| 5,122,680 | 6/1992 | Stakely et al. | 307/362 |

*Primary Examiner*—Margaret R. Wambach
*Attorney, Agent, or Firm*—Bernard Franzblau

[57] ABSTRACT

A comparator circuit comprising a comparator which includes a first and a second supply terminal for connection to a supply voltage. A first input terminal is connected to a reference voltage and a second input terminal is connected via an attenuation circuit to a signal terminal for connection to an input voltage. The attenuation circuit includes a resistor, a bias voltage terminal for connection to a bias voltage, and a MOS transistor having a gate (g), backgate (bg), source (s) and drain (d). The drain is connected to the signal terminal and the source and the backgate are connected to the second input terminal. The gate is connected to the bias voltage terminal and the resistor is inserted between the gate and the source of the transistor. In the case of high input voltages on the signal terminal, the MOS transistor operates in its saturation range and the voltage on the source continues to be substantially equal to the bias voltage. If the drain voltage falls below the bias voltage (Vbias), the MOS transistor is rendered conductive in the linear range and the voltage on the source follows the voltage on the drain. The comparator thus is protected against excess voltage on the second input terminal.

5 Claims, 1 Drawing Sheet

COMPARATOR CIRCUIT COMPRISING INPUT SIGNAL ATTENUATOR

BACKGROUND OF THE INVENTION

This invention relates to a comparator circuit comprising a comparator which includes a first and a second supply terminal for connecting a supply voltage to these terminals, a first input terminal for connecting a reference voltage, and a second input terminal connected via an attenuation means to a signal terminal for connection to an input voltage. A comparator circuit of this type is of general knowledge and is used for a great variety of applications. The input voltage is compared with the reference voltage and the comparator signals when the input voltage exceeds the reference voltage. The reference voltage has a value which lies in the supply voltage range of the comparator. For measuring input voltages which are large relative to the comparator reference and supply voltages, an attenuator is generally used to bring the input voltage within the range determined by the supply voltage. In lieu of the attenuation means, a resistance divider may be used which has a large series resistance between the signal terminal and the second input terminal and, as required, a further resistance between the second input terminal and the second supply terminal. In that case there is a linear relationship between the input voltage and the attenuated voltage on the second input terminal of the comparator. In many cases the linear relationship is not even required. In that case the attenuation means may, in known fashion, consist of a series resistance between the signal terminal and the second input terminal and clamping means between the second input terminal and the second supply terminal so as to limit the signal. A disadvantage of these known attenuators is the series resistance. This has to be a large value which is objectionable especially in integrated circuits. Another known non-linear attenuation is obtained by means of a diode whose cathode is connected to the signal terminal and whose anode is connected to the second input terminal of the comparator and also, by means of a series resistance, to the reference voltage source. The diode is blocked to high signal voltages and rendered conductive in the case of signal voltages smaller than or equal to the reference voltage. A disadvantage of this known attenuator is the voltage drop across the diode, which is undesirable in the case of relatively small input voltages.

SUMMARY OF THE INVENTION

It is an object of the invention to provide a comparator circuit comprising an attenuation means which permits a large input voltage range, integrates well and presents a substantially linear attenuation for small input signals. Thereto, according to the invention, the comparator circuit mentioned in the opening paragraph is characterized in that the attenuation means comprises a resistor, a bias voltage terminal for connecting a bias voltage, and a MOS transistor with a gate, backgate, source and drain, the drain being connected to the signal terminal, the source and the backgate being connected to the second input terminal, the gate being connected to the bias voltage terminal and the resistor being inserted between the gate and the source.

With the aid of this attenuation means, in the case of high input voltages the MOS transistor operates in its saturation range and forms a high impedance between the signal terminal and the second input terminal. In the case of low input voltages the MOS transistor operates in the linear range and forms a low impedance (RDS-on) between these terminals.

Integrated circuits are usually formed in a monolithic semiconductor substrate. The voltages applied to the circuit must not fall below the substrate voltage, at any rate for a P-substrate. For an N-substrate the reverse is the case and voltages must not exceed the substrate voltage. In order to still admit input voltages (for the P-substrate) which are lower than the substrate voltage, a further embodiment of the comparator circuit according to the invention is characterized in that the MOS transistor is a DMOS transistor inserted in an island-shaped area of a first conductivity type on a substrate of a second conductivity type which is the opposite of the first conductivity type, in which the island-shaped area is surrounded by a first well of the second conductivity type isolated from the substrate by a second well of the first conductivity type surrounding the first tub, and by a buried layer of the first conductivity type stretching out between the first well and the substrate, the first and the second tubs each having a terminal which is connected to the source and gate respectively. If the drain voltage falls below the substrate voltage, the junction formed by the first and second wells will be rendered non-conductive. In the case of a high drain voltage, the source voltage is never higher than the bias voltage of the bias voltage source and said junction will likewise be rendered non-conductive. The use of DMOS transistors allows a very high input voltage and renders the comparator circuit pre-eminently suitable for use in circuits directly fed from a rectified mains voltage carrying several hundred volts. The input voltage, for example, when the circuit is switched on, may then temporarily be much higher than permitted for the comparator.

BRIEF DESCRIPTION OF THE DRAWING

These and other aspects of the invention will be described and explained in greater detail with reference to the appended drawing, in which.

In the drawing, Figure elements having like functions or connotations have like reference characters.

DESCRIPTION OF THE PREFERRED EMBODIMENTS

Figure 1:
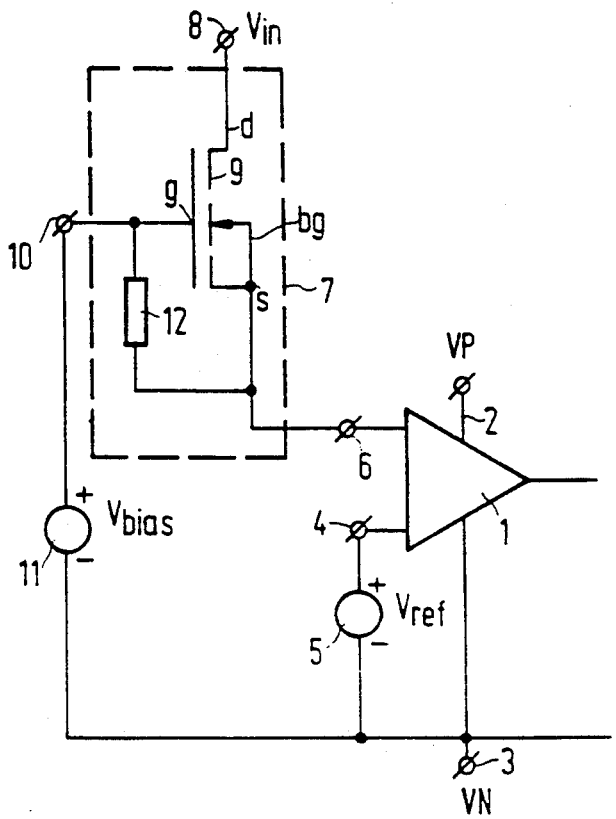
FIG. 1 shows a comparator circuit according to the invention.

FIG. 1 shows an integrated version of a comparator circuit according to the invention. The circuit comprises a comparator 1 which includes a first supply terminal 2 to which a positive supply voltage VP is connected and includes a second supply terminal 3 to which a negative supply voltage VN is connected. The second supply terminal 3 is also connected to the P-substrate of the integrated comparator circuit. The comparator 1 comprises a first input terminal 4 to which a reference voltage source 5 is connected which supplies a reference voltage Vref relative to the second supply terminal 3. The comparator 1 further includes a second input terminal 6 connected via an attenuation means 7 to a signal terminal 8 to which an input voltage Vin is connected. The attenuation means comprises a MOS transistor 9 with a drain d connected to the signal terminal 8, a source s and a backgate bg which are interconnected and also connected to the second input terminal 6, a gate g connected to the bias voltage terminal 10 to which a bias voltage source 11 is connected, which source supplies a bias voltage Vbias relative to the second supply terminal 3, and also a resistor 12 inserted between the gate g and the source s of the MOS transistor 9.

The positive supply voltage VP and the bias voltage Vbias are, for example, 7 volts. The threshold voltage of the MOS transistor 9 is, for example, 2.5 volts. The resistor 12 has a value of, for example, 1 megohm. The source s is capable of following the voltage on the drain d via the backgate drain junction once the drain voltage has fallen below Vbias minus 0.7 volt (6.3 V). If the drain voltage falls below Vbias minus the threshold voltage (7 V−2.5 V=4.5 V), the channel of the MOS transistor 9 is rendered conductive and the backgate drain junction is shunted by the relatively low impedance Rds-on of the channel. In that case the source s rather accurately follows the voltage on the drain d. For drain voltages exceeding the bias voltage Vbias, the MOS transistor 9 is in saturation, and the source voltage is substantially independent of the drain voltage and maintains a constant value of approximately Vbias. The drain voltage and thus also the input voltage Vin may then increase in so far as the MOS transistor 9 is capable of withstanding such voltage, and without the source voltage and thus also the voltage on the second input terminal 6 of the comparator 1 increasing. The result of this is that on the second input terminal 6 of the comparator 1 no voltages become available which exceed the bias voltage Vbias. By selecting a value for Vbias which is safe for the comparator 1, for example, VP, but lower or higher values are also permitted, failure of the comparator 1 is prevented if the input voltage Vin on the signal terminal 8, temporarily or not, or purposely, has a high value. The breakdown voltage of the MOS transistor 9 eventually determines the maximum permitted value for the input voltage Vin. For a lateral DMOS transistor (Double Diffused Metal Oxide Semiconductor) the breakdown voltage may be several hundred volts.

Figure 2:
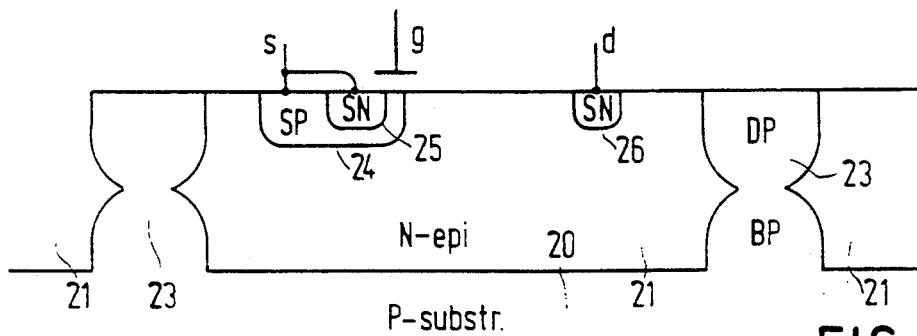
FIG. 2 shows a lateral DMOS transistor to be used in a comparator circuit according to the invention.

FIG. 2 shows the structure of a lateral DMOS transistor on a P-substrate 20 which has an N-epitaxial layer 21 and isolation zones 23 of P-material. In the layer 21 there is the body (backgate) 24 of P-material and included therein is the source 25 of N-material. Body 24 as well as source 25 are interconnected via source contact s. At some distance from the body 24 there is the drain 26 which, just like the source 25, is made of N-material and comprises a drain contact d. The gate g is disposed over the body 24 and source 25 and is isolated therefrom.

Figure 3:
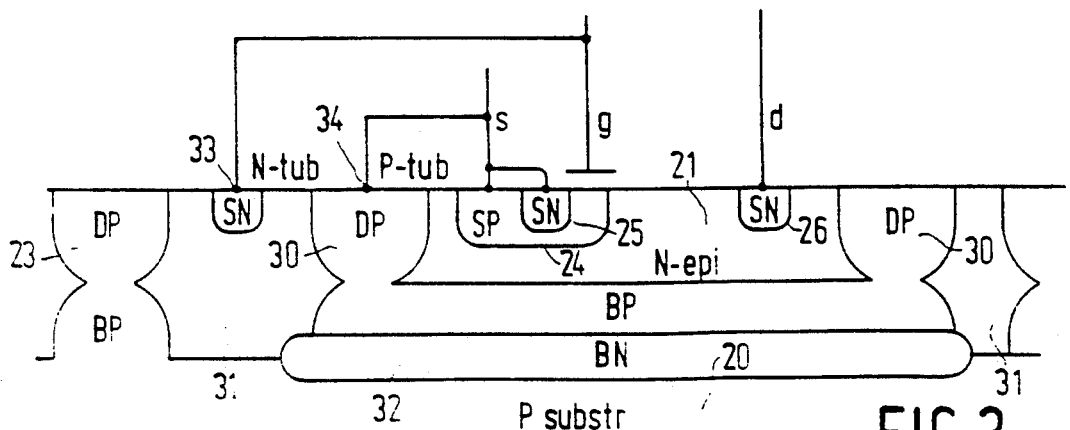
FIG. 3 shows an alternative lateral DMOS transistor to be used in a comparator circuit according to the invention.

The junction between drain 26 and substrate 20 prevents the application to signal terminal 8 of input voltages that are below the substrate voltage (0 volts). By surrounding the lateral DMOS transistor with a P-well 30 isolated from the P-substrate 20 by an N-well 31 and an N-type buried layer 32, as is demonstrated in FIG. 3, negative input voltages relative to the substrate also can be admitted. For this purpose, a contact 33 of the N-tub 31 is connected to gate g and a contact 34 of the p-tub is connected to the source s of the lateral DMOS transistor. If the drain d is supplied with a voltage of, for example, −10 volts relative to the P-substrate 20, the voltage of the P-well 30 is also about −10 volts and the junction between the P-well 30 and the buried N-layer 32 is rendered non-conductive with a voltage of 17 volts. If the drain voltage is high, for example, 200 volts, the source voltage does not exceed Vbias (7 volts) and the junction between the P-well 30 and the buried N-layer 32 is also rendered non-conductive.

The conductivity types of the materials shown may also be selected to be of the opposite type. In that case the polarity of all of the voltages is to be reversed. The comparator circuit according to FIG. 1 may naturally also comprise discrete components. For example, a normal discrete vertical DMOS transistor may then be substituted for MOS transistor 9.

I claim:

1. A comparator circuit comprising: a comparator which includes a first and a second supply terminal for connection to a supply voltage, a first input terminal for connection to a reference voltage, and a second input terminal connected via an attenuation means to a signal terminal for connection to an input voltage, characterized in that the attenuation means comprises a resistor, a bias voltage terminal for connecting a bias voltage, and a MOS transistor having a gate, backgate, source and drain, the drain being connected to the signal terminal, the source and the backgate being connected to the second input terminal, the gate being connected to the bias voltage terminal and the resistor being inserted between the gate and the source.

2. A comparator circuit as claimed in claim 1, characterized in that the MOS transistor comprises a DMOS transistor, located in an island-shaped area of a first conductivity type (N) on a substrate of a second conductivity type (P) which is the opposite of the first conductivity type, wherein the island-shaped area is surrounded by a first well of the second conductivity type (p) isolated from the substrate by a second well of the first conductivity type (N) surrounding the first well, and by a buried layer of the first conductivity type extending between the first well and the substrate, the first and the second wells each having a terminal connected to the source and gate, respectively.

3. A comparator circuit as claimed in claim 1 wherein, by means of the attenuation means and a bias voltage at said bias voltage terminal, the MOS transistor operates in its saturation region for high input voltages so as to present a high impedance between the signal terminal and the second input terminal and operates in its linear region for low input voltages thereby to present a low impedance between said signal and second input terminals.

4. A comparator circuit as claimed in claim 3 wherein for the high input voltages the MOS transistor source voltage is substantially equal to the bias voltage and for said low input voltages the MOS transistor drain voltage drops below the bias voltage so that the MOS transistor source voltage follows the drain voltage.

5. A comparator circuit as claimed in claim 1 wherein the MOS transistor comprises a DMOS transistor formed in a monolithic semiconductor body.

* * * * *